United States Patent
Marutani

(10) Patent No.: US 10,573,796 B2
(45) Date of Patent: Feb. 25, 2020

(54) METHOD OF MANUFACTURING LIGHT EMITTING ELEMENT MOUNTING BASE MEMBER, AND METHOD OF MANUFACTURING LIGHT EMITTING DEVICE

(71) Applicant: NICHIA CORPORATION, Anan-shi (JP)

(72) Inventor: Yukitoshi Marutani, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 16/223,229

(22) Filed: Dec. 18, 2018

(65) Prior Publication Data
US 2019/0148610 A1 May 16, 2019

Related U.S. Application Data

(62) Division of application No. 15/475,161, filed on Mar. 31, 2017, now Pat. No. 10,193,039.

(30) Foreign Application Priority Data

Apr. 1, 2016 (JP) ................................. 2016-074775

(51) Int. Cl.
*H01L 33/62* (2010.01)
*H01L 25/13* (2006.01)
(Continued)

(52) U.S. Cl.
CPC .............. *H01L 33/62* (2013.01); *H01L 25/13* (2013.01); *H01L 33/52* (2013.01); *H01L 33/58* (2013.01);
(Continued)

(58) Field of Classification Search
CPC .......... H01L 33/58; H01L 33/52; H01L 33/62
See application file for complete search history.

(56) References Cited

U.S. PATENT DOCUMENTS 6,707,158 B2 * 3/2004 Nose .................... H01L 21/4846
257/777
2002/0132450 A1 9/2002 Nose
(Continued)

FOREIGN PATENT DOCUMENTS

| JP | 6-302864 | 10/1994 |
| JP | 10-193020 | 7/1998 |

(Continued)

OTHER PUBLICATIONS

Office Action with Form PTO-892 Notice of References Cited issued by the U.S. Patent and Trademark Office for the parent U.S. Appl. No. 15/475,161, dated Dec. 21, 2017.
(Continued)

*Primary Examiner* — Trang Q Tran
(74) *Attorney, Agent, or Firm* — Mori & Ward, LLP

(57) ABSTRACT

A method of manufacturing a light emitting element mounting base member includes: arranging a plurality of core members each including an electrical conductor core and a light-reflecting insulating member provided on a surface of the electrical conductor core; cutting the arranged core members to form a base member preparatory body including at least one cut surface on which at least one of the electrical conductor cores and the insulating members are exposed; and insert molding by placing the base member preparatory body in a set of mold, and injecting a light blocking resin composition into the set of mold such that at least one of the electrical conductor cores or at least one metal film formed
(Continued)

on at least one of the electrical conductor cores are exposed on at least one outer surface of the light emitting element mounting base member.

9 Claims, 5 Drawing Sheets

(51) Int. Cl.
    *H01L 33/52*    (2010.01)
    *H01L 33/58*    (2010.01)
    *H01L 33/60*    (2010.01)

(52) U.S. Cl.
    CPC ........ *H01L 33/60* (2013.01); *H01L 2933/005* (2013.01); *H01L 2933/0058* (2013.01); *H01L 2933/0066* (2013.01)

(56) References Cited

U.S. PATENT DOCUMENTS

2011/0133232 A1    6/2011    Yoshioka et al.
2013/0214319 A1    8/2013    Lee

FOREIGN PATENT DOCUMENTS

| | | |
|---|---|---|
| JP | 2002-270711 | 9/2002 |
| JP | 2002-270724 | 9/2002 |
| JP | 2002-270725 | 9/2002 |
| JP | 2002-270726 | 9/2002 |
| JP | 2002-314245 | 10/2002 |
| JP | 2007-27157 | 2/2007 |
| JP | 2007-214162 | 8/2007 |
| JP | 2007-227737 | 9/2007 |
| JP | 2007-273602 | 10/2007 |
| JP | 2007-273603 | 10/2007 |
| JP | 2008-235469 | 10/2008 |
| JP | 2010-135718 | 6/2010 |
| JP | 2010-186022 | 8/2010 |
| JP | 2015-111620 | 6/2015 |

OTHER PUBLICATIONS

Notice of Allowance issued by the U.S. Patent and Trademark Office for the parent U.S. Appl. No. 15/475,161, dated Sep. 18, 2018.

* cited by examiner

METHOD OF MANUFACTURING LIGHT EMITTING ELEMENT MOUNTING BASE MEMBER, AND METHOD OF MANUFACTURING LIGHT EMITTING DEVICE

CROSS-REFERENCE TO RELATED APPLICATION

This application is a divisional application of the U.S. patent application Ser. No. 15/475,161 filed Mar. 31, 2017, which claims priority to Japanese Patent Application No. 2016-074775, filed on Apr. 1, 2016, the disclosure of which is hereby incorporated by reference in its entirety.

BACKGROUND

Field of the Invention

The present disclosure relates to a method of manufacturing a light emitting element mounting base member, and a method of manufacturing a light emitting device.

As light sources of various kinds, a light emitting device that incorporates a light emitting element such as a light emitting diode (LED) chip is used. One of these light emitting devices includes a light emitting element and a base member on which the light emitting element is mounted. For example, Japanese Unexamined Patent Publication No. 2008-235469 and Japanese Unexamined Patent Publication No. 2010-135718 describe light emitting devices using light emitting elements mounted in an assembly of light emitting device housings in which a lead frame obtained by processing a metal sheet by punching, etching or other methods is integrated with a resin using an insert molding technique.

SUMMARY

According to one aspect of the present disclosure, a method of manufacturing a light emitting element mounting base member includes: arranging a plurality of core members each including an electrical conductor core and a light-reflecting insulating member provided on a surface of the electrical conductor core; cutting the arranged core members to form a base member preparatory body including at least one cut surface on which at least one of the electrical conductor cores and the insulating members are exposed; and insert molding by placing the base member preparatory body in a set of mold, and injecting a light blocking resin composition into the set of mold such that at least one of the electrical conductor cores or at least one metal film formed at least one of the electrical conductor cores are exposed on at least one outer surface of the light emitting element mounting base member.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF EMBODIMENTS

Figure 1A:
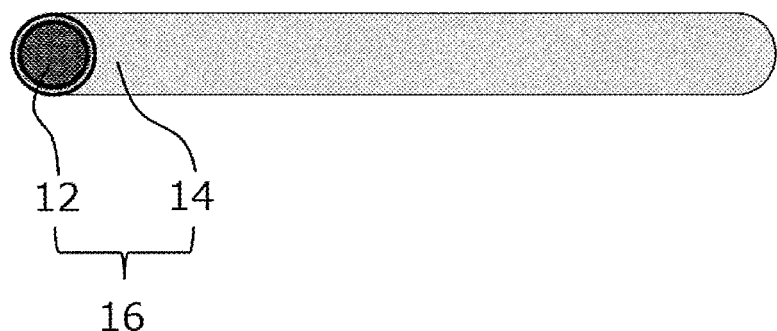
FIG. 1A is a schematic cross sectional view showing a core member.

A process of forming the lead frames in manufacturing an assembly of light emitting device housings necessitates punching or etching, which generates a large amount of wastes and waste liquid, thereby leading an increase in costs of the lead frames, and consequently in costs of the ultimately manufactured light emitting device.

The present aspects have been made in view of the above-mentioned circumstances, and an object thereof is to provide a method of manufacturing a light emitting element mounting base member with a reduced cost, a method of manufacturing a light emitting device using the light emitting element mounting base member, a light emitting element mounting base member, and a light emitting device using the light emitting element mounting base member.

Hereinafter, embodiments of the present disclosure will be described with reference to the drawings as necessary. It is to be noted that a light emitting element mounting base member and a method of manufacturing a light emitting element mounting base member as described below is intended to implement the technical concept of the present disclosure, and the present disclosure is not limited to the following unless otherwise specified. Further, the description provided in one embodiment or example is applicable to other embodiment or example. In the description of the structure of other embodiment, identical or similar members are denoted by identical names, and their detailed descriptions are omitted as appropriate. The sizes, positional relations and so on of members shown in the drawings may be exaggerated for clarification of explanations.

A method of manufacturing a light emitting element mounting base member 100 according to the present embodiment includes: arranging a plurality of core members 16 each including an electrical conductor core 12 and a light-reflecting insulating member 14 provided on the surface of the electrical conductor core 12; cutting the arranged core members to form a base member preparatory body 40 having at least one cut surface on which the electrical conductor cores 12 and the insulating members 14 are exposed; placing the base member preparatory body 40 in a set of mold having an upper mold and a lower die; and insert molding by injecting a light blocking resin composition into the set of mold. Hereinafter, a description will be given of the method of manufacturing the light emitting element mounting base member according to the present embodiment with reference to FIGS. 1A to 9.

Arranging Core Members

Figure 2:
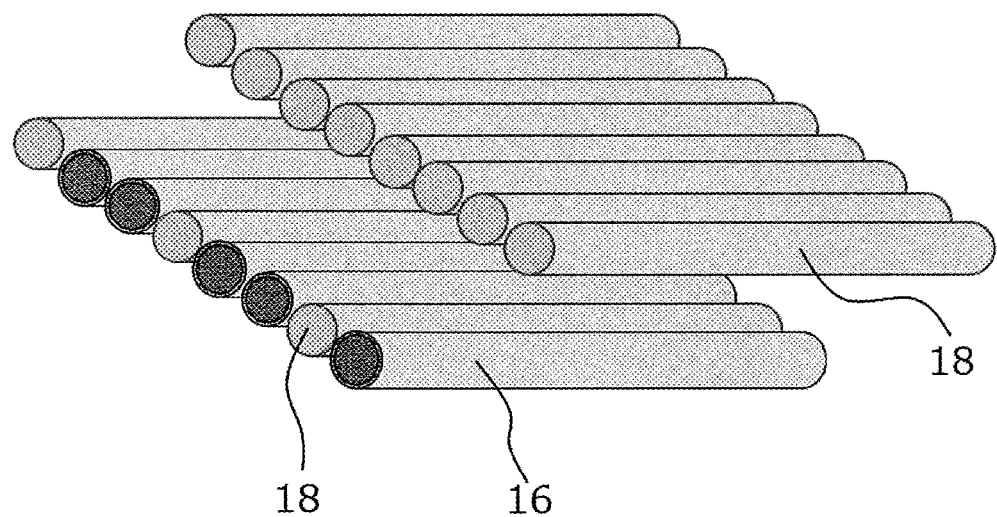
FIG. 2 is a schematic diagram illustrating a manufacturing method according to one embodiment of the present disclosure.

As shown in FIG. 2, the core members 16 being each cylindrical columnar in shape are arranged. Here, using insulating spacer members 18 each having cylindrical columnar in shape and substantially the same size as the core member 16, the positions of the core members 16 are adjusted. In the present embodiment, a row in which one insulating spacer member 18 is disposed between core member sets each formed by a plurality of (two pieces in FIG. 2) core members 16 arranged in line, and another row in which only insulating spacer members 18 are disposed, are alternately repeatedly disposed.

Joining Core Members

Figure 3:
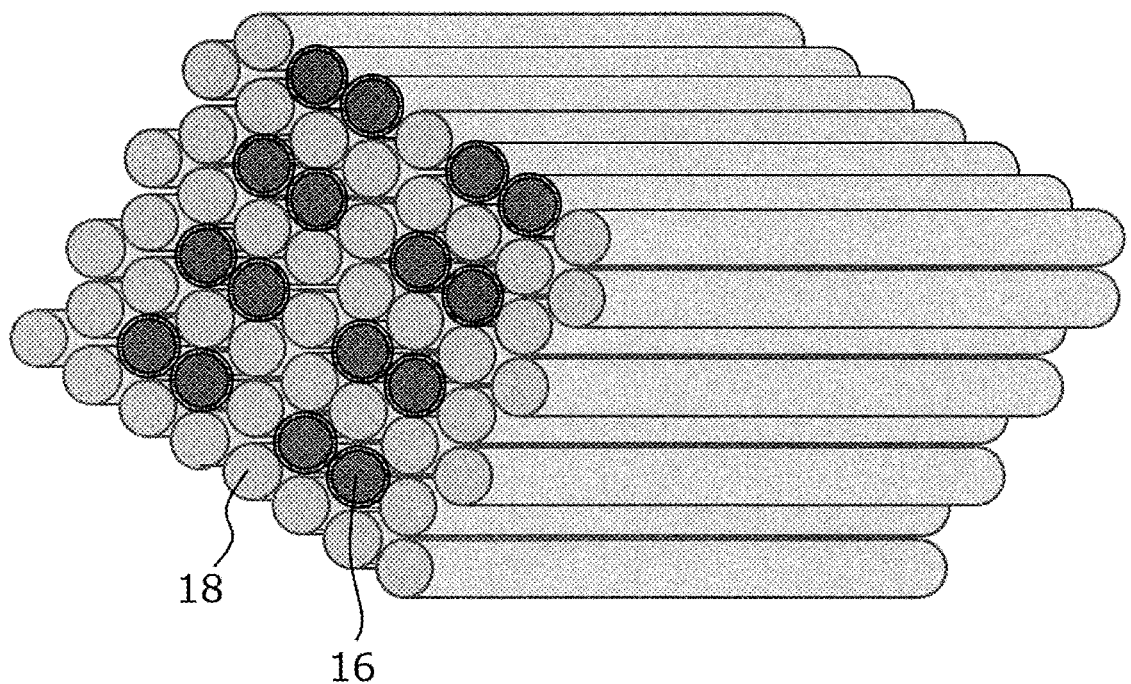
FIG. 3 is a schematic diagram illustrating the manufacturing method according to one embodiment of the present disclosure.

The arrangement is repeatedly performed, to form an assembly of the core members 16 and the insulating spacer members 18 as shown in FIG. 3. The adjacent rows are joined to one another with an adhesive agent or other joining technique.

As shown in FIG. 1A, each core member 16 includes the electrical conductor core 12, and the light-reflecting insulating member 14 that covers the lateral surface of the electrical conductor core 12. The electrical conductor core 12 may be tetragonal columnar or hexagonal columnar in shape, other than a shape of cylindrical columnar. The core member 16 having a columnar (e.g., rod-like shape) preferably has a sufficient length to obtain a greater number of base member preparatory bodies through cutting process. The size of the electrical conductor core 12 may be selected as appropriate depending on the size of a light emitting element 24 mounted thereon and the size of a light emitting device 200 obtained according to the present embodiment. For example, when the electrical conductor core 12 is cylindrical columnar in shape, it may have a diameter in a range of about 0.1 mm to about 2.0 mm, and a length in a range of about 1 cm to about 100 cm.

The light-reflecting insulating member 14 covers the lateral surface of the electrical conductor core 12. The light-reflecting insulating member 14 may be formed on the entire surface of the electrical conductor core 12, for example, by repeating the following steps the required number of times: spray-coating the entire surface of the electrical conductor core 12 with the light-reflecting insulating member 14, and baking light-reflecting second insulating member 14. The thickness of the light-reflecting insulating member 14 may be, for example, in a range about 0.01 mm to about 0.1 mm.

Figure 1B:
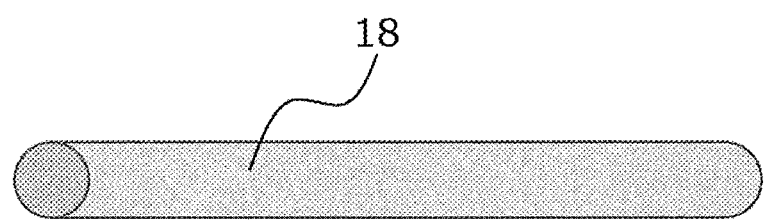
FIG. 1B is a schematic cross sectional view showing an insulating spacer member.

The insulating spacer member 18 is preferably entirely made of an insulating material. Further, as shown in FIG. 1B, the size and shape of the insulating spacer member 18 are preferably substantially identical to those of the employed core member.

Figure 9:
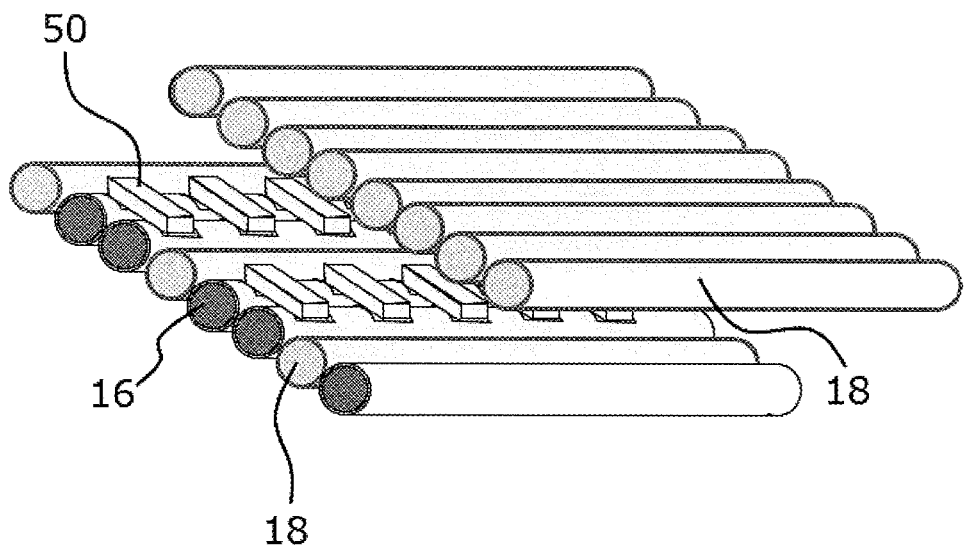
FIG. 9 is a schematic diagram illustrating a manufacturing method according to one embodiment of the present disclosure.

The light emitting element mounting base member 100 may include protection devices 50. As shown in FIG. 9, the protection devices 50 are each connected to two or more predetermined core members 16 at the lateral surface (i.e., the columnar lateral surface) thereof in such a manner as to be electrically connected to two or more electrical conductor cores 12. The insulating members 14 are removed at portions where the electrical conductor cores 12 are electrically connected to the protection devices 50. On the core members 16 to which the protection devices 50 are connected, the insulating spacer members 18 are overlaid, to form an assembly of the core members 16 and the insulating spacer members 18 in a similar manner which has been described with reference to FIG. 3. Recesses may be provided at the insulating spacer members 18 in such a manner as to correspond to the positions where the protection devices 50 are disposed.

Forming Base Member Preparatory Body

Figure 4:
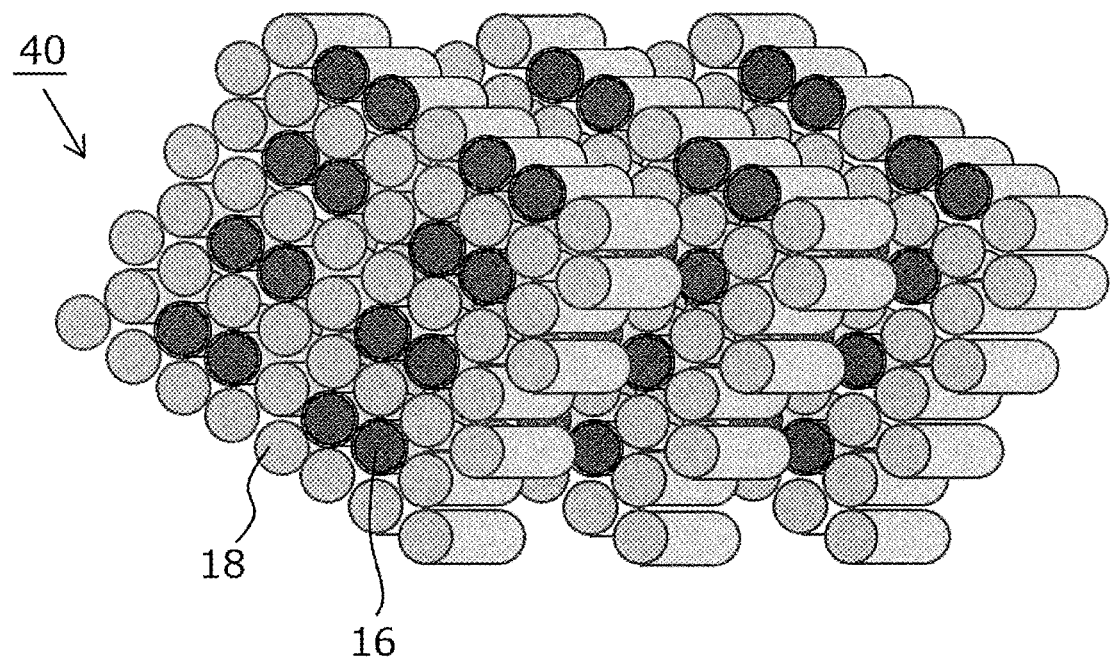
FIG. 4 is a schematic diagram illustrating the manufacturing method according to one embodiment of the present disclosure.

As shown in FIG. 4, the assembly of the core members 16 and the insulating spacer members 18 are cut, to form a base member preparatory body 40. Such cutting can be performed at an angle of approximately 90° relative to the center axis of the columnar shape of the core members 16 and the insulating spacer members 18. Other than approximately 90°, the cutting may be performed at a predetermined angle with which a plurality of electrical conductor cores are exposed at the cut surface. Thus, the electrical conductor cores 12 and the insulating members 14 are exposed at the cut surface. The cutting provides the plate-like base member preparatory body 40 in which the electrical conductor cores 12, the insulating members 14, and the insulating spacer members 18 are exposed substantially flush with one another at the upper and lower surfaces. The cutting may be performed using a saw such as a circular saw, a Thomson blade or other equipment. The cutting may also be performed by slicing, for example, using laser processing. In the case where the assembly of the core members 16 and the insulating spacer members 18 has the protection devices 50, the cutting is performed at portions where the protection devices 50 are not present. In forming a light blocking resin which will be described later, the protection devices 50 are embedded in the base member.

Forming Metal Films

Figure 5:
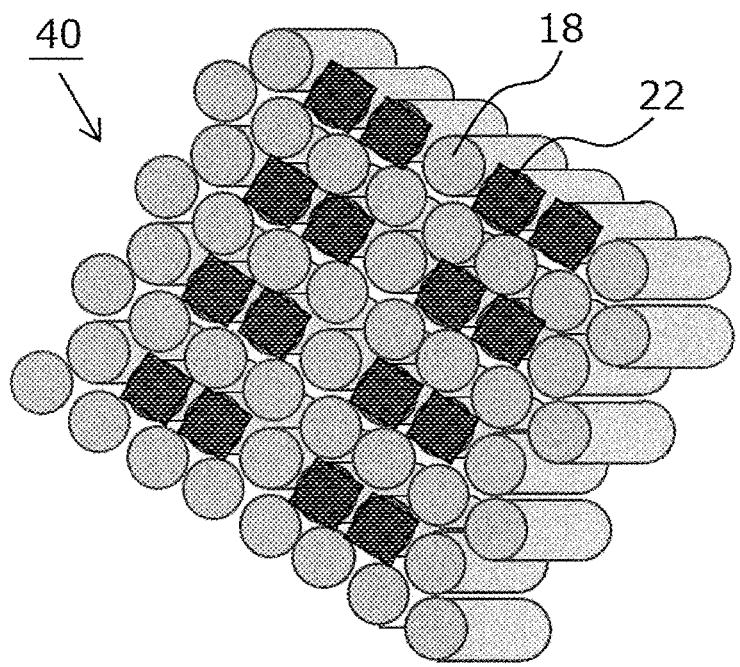
FIG. 5 is a schematic diagram illustrating the manufacturing method according to one embodiment of the present disclosure.
Figure 6:
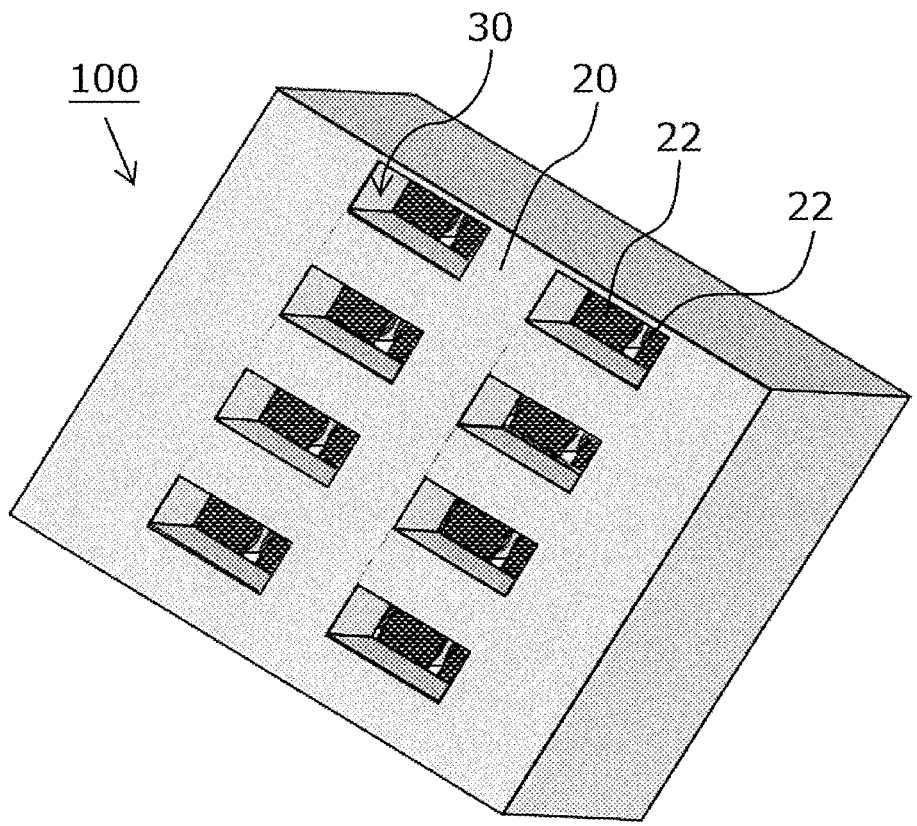
FIG. 6 is a schematic diagram illustrating a light emitting element mounting base member according to one embodiment of the present disclosure.

Metal films 22 may be formed on the exposed predetermined portions of the electrical conductor cores 12 of the base member preparatory body 40, for example, by plating, sputtering, or bonding metal foils. In the present embodiment, as shown in FIG. 5, one metal film 22 is disposed corresponding to the exposed surface of one electrical conductor core 12. Because the metal films 22 are connected to the light emitting elements 24 or to the outside of the light emitting devices via connection terminals (e.g., connectors) or other component, the metal films 22 are preferably made of a material that is well electrical conductive or capable of establishing good mechanical and electrical connection. A material having high light-reflecting property, for example, silver is used for the metal film 22 on the upper surface side, in other words, a surface on which the light emitting elements 24 are to be mounted. The metal film may not be formed on all the exposed surfaces of the electrical conductor cores, and need only be formed on necessary areas. The forming the metal films 22 can be performed, or can be omitted depending on the material or structure of the electrical conductor cores.

Insert Molding

The base member preparatory body 40 provided with the metal films 22 at its surface as shown in FIG. 5 is placed in a set of mold, and insert molding is performed by injecting a light blocking resin composition into the set of mold. This provides the light emitting element mounting base member 100 having recesses 30 shown in FIG. 6. The upper mold has projection portions that correspond to the recesses 30. The light blocking resin composition is injected into a space in the set of mold with the projection portions pressing the electrical conductor cores 12 or the metal films 22 formed on the electrical conductor cores. Thereafter, the light blocking resin composition is cured, and the light emitting element mounting base member 100 is formed with the recesses having bottom surfaces on which the electrical conductor cores are exposed.

The light blocking resin composition is injected into the space between the core members 16 and the insulating spacer members 18 which are fixed to one another using adhesive agent or other technique to form the base member preparatory body 40. Simultaneously, the light blocking resin composition can be injected into the space in the set of mold made up of the upper mold having the projection portions and the lower mold. Then, the injected resin is cured. Thus, the plurality of core members are integrally fixed with the light blocking resin 20, while the recesses formed by the light blocking resin 20 are formed. At the bottom surface of each recess 30 serving as part of the outer surface, two adjacent metal films 22 are exposed as well as the insulating member 14 and the light blocking resin 20. In the case where formation of metal films 22 is not performed before the insert molding, the electrical conductor cores 12 are exposed. The electrical conductor cores 12 or the metal films 22 formed on the electrical conductor cores 12 are exposed at the upper surface and the back surface of the light emitting element mounting base member 100, in other words, the surface opposite to the surface where the recesses 30 are formed (i.e., the lower surface) as well.

In the metal film-equipped light emitting element mounting base member 100 formed in a manner as described above, at the upper surface (i.e., the bottom surfaces of the recesses) and/or the lower surface serving as a part of the outer surface of the metal film-equipped light emitting element mounting base member 100, the electrical conductor cores 12 and the insulating members 14 are exposed from the light blocking resin 20. That is, the light emitting elements are to be mounted on the upper surface of the light emitting element mounting base member 100. The electrical conductor cores 12 or the metal films 22 are exposed at the predetermined areas of the upper surface. The electrical conductor cores 12 or the metal films 22 are also exposed on the predetermined areas of the lower surface of the light emitting element mounting base member 100, when an external electrode terminal or a heat dissipating surface is provided on the lower surface. The upper surface and/or the lower surface of the light emitting element mounting base member 100 is/are formed with the electrical conductor cores 12, the insulating member 14, and the light blocking resin 20. The metal films 22 may be formed on or above the upper surfaces of the electrical conductor cores 12, those of the insulating members 14, and those of the light blocking resin 20.

After insert molding, the metal films 22 may be formed on the surfaces of the electrical conductor cores 12 that are exposed at the outer surface.

Mounting Light Emitting Elements

Figure 7:
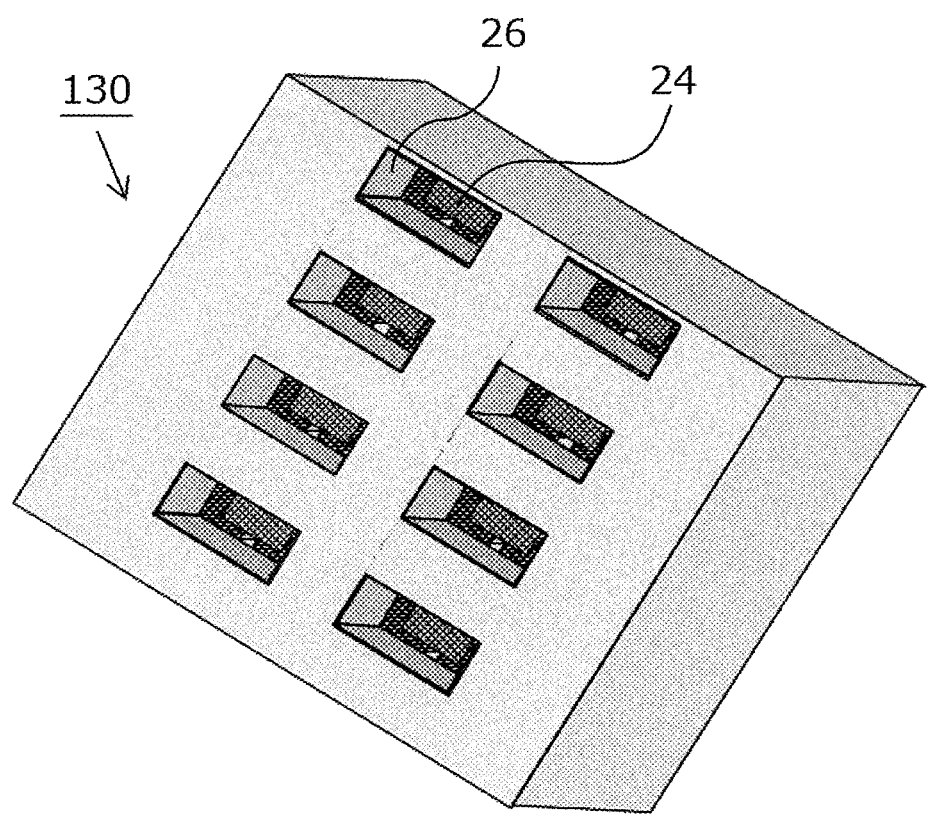
FIG. 7 is a schematic diagram illustrating a manufacturing method according to one embodiment of the present disclosure.

A light emitting element is mounted in each of the recesses 30 of the metal film-equipped light emitting element mounting base member 100 obtained in this manner. In the present embodiment, as shown in FIG. 7, the light emitting elements 24 each having a pair of positive and negative electrodes on one surface are respectively flit-chip mounted in the recesses 30. At this time, one metal film 22 and positive or negative electrode of one light emitting element 24 are electrically connected to each other. The electrical connecting between the light emitting element mounting base member 100 and the light emitting elements 24 may be performed using solder, anisotropic conductive paste or other technique.

Encapsulating Light Emitting Elements

After the light emitting elements 24 are mounted, an encapsulating member 26 is supplied into the recesses 30, to form a light emitting device assembly 130.

Singulating

Figure 8:
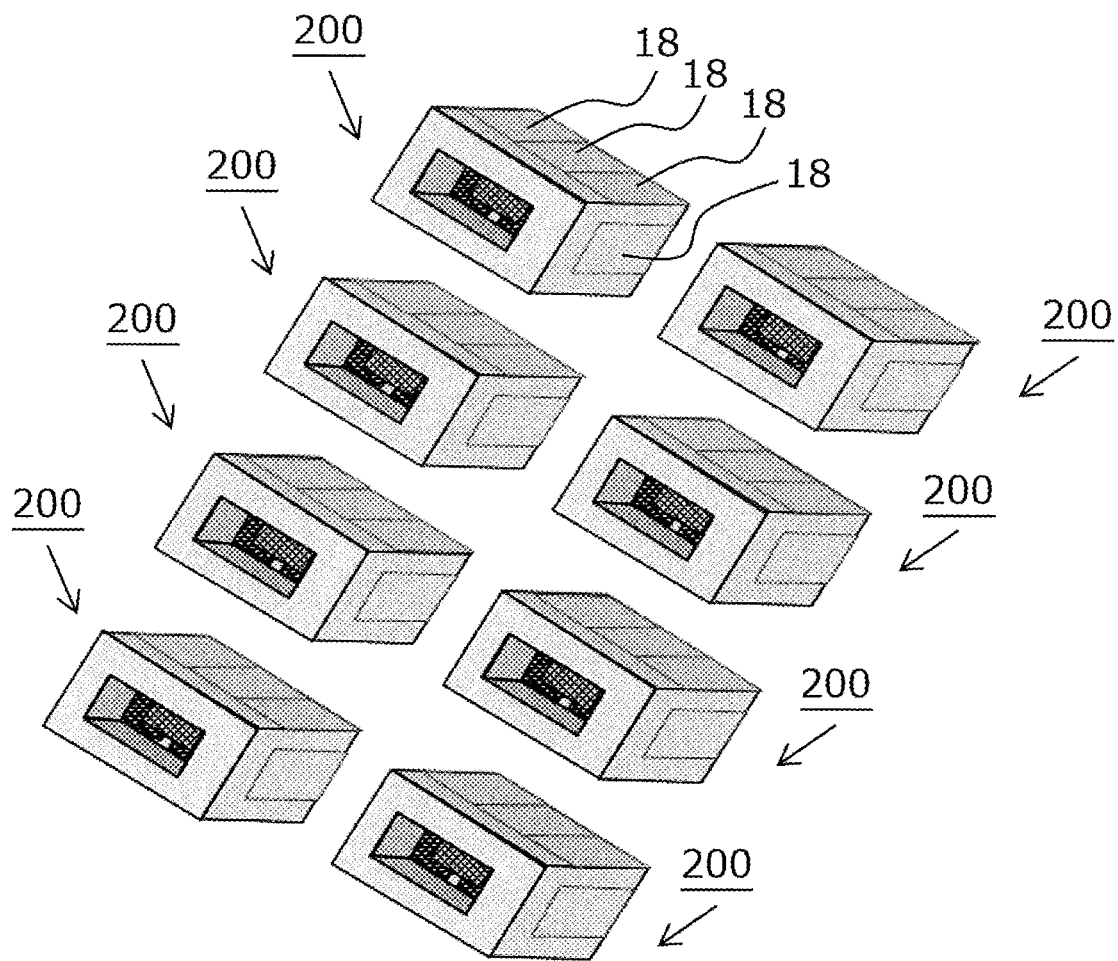
FIG. 8 is a schematic diagram illustrating a light emitting device according to one embodiment of the present disclosure.

The light emitting device assembly 130 is cut along predetermined cutting lines, by cutting the light blocking resin or other members. Thus, light emitting device assembly 130 is singulated to obtain the light emitting devices 200. Here, the singulation is performed along the cutting lines that pass the upper surface of the lateral walls of the recesses. Thus, the light emitting devices 200 each having the recess shown in FIG. 8 are obtained. The cutting can be performed by dicing, punching or other technique.

Hereinafter, a description will be given of materials and the like suitable for the constituent members of the light emitting device according to the embodiments.

Core Member

The core member at least includes the electrical conductor core and the light-reflecting insulating member. The core member is, for example, a metal core equipped with a light-reflecting insulating film, a metal sphere equipped with a light-reflecting insulating film or a graphite sphere equipped with a light-reflecting insulating film. The surface of the core member may have a fine irregular shape in order to enhance joining strength with the light blocking resin.

Electrical Conductor Core

The electrical conductor core is a member used as the electrode and/or the heat dissipation path of the light emitting device. For this purpose, the electrical conductor core may be made of an electrically conductive material such as metal. For example, the material of the electrical conductor core may be metal such as Cu, Al, Ag, Au, Pt, Pd, or Rh or alloy thereof, or a carbon material such as graphite. The electrical conductor core preferably reflects light emitted by the light emitting element mounted on the light emitting element mounting base member, for example, by 70%, and preferably by 80% or more. For example, in the case where the light emitting element emits blue or bluish light, the electrical conductor core is preferably made of Al, Ag or the like.

The electrical conductor core may be entirely in a single composition, or may have a plurality of regions differing in composition. For example, the electrical conductor core may have a multilayer structure in which two or more types of materials are included to form a first metal part covered with a second metal part by plating or the like. The electrical conductor core may contain an insulating material or member such as voids. The electrical conductor core may be made of an anisotropic conductive material, such as a stranded wire or a litz wire.

The shape of the electrical conductor core may be, for example, a cylindrical column, a prism (or a polyhedron), a sphere (including an ellipsoid), a round pipe (or a round tube), or a three-dimensional shape similar to the foregoing, or a beadroll-like shape formed by joining the foregoing shape. The shape of the electrical conductor core is selected as appropriate depending on the structures provided in the light emitting element mounting base member, such as a through hole or a castellation.

The electrical conductor core is partially exposed outside the surfaces of the light emitting element mounting base member. At the exposed portion, the electrical conductor core is electrically connected to the light emitting element using a joining member such as a wire or solder. Accordingly, the electrical conductor core preferably has the size or the shape which allows the exposed portion to have the area and shape suitable for establishing connection with the light emitting element. For example, the electrical conductor core is exposed to be substantially flush with the upper surface and the lower surface of the light emitting element mounting base member. In the case where the metal film described later is provided in such a manner as to cover the exposed portion of the electrical conductor core, the metal film and the light emitting element are connected to each other via a joining member.

The light emitting element that is mounted on the light emitting element mounting base member may be in contact with any of the electrical conductor core, the light-reflecting insulating member, and the light blocking resin. Mounting the light emitting element on the electrical conductor core facilitates dissipation of heat generated by the light emitting element. The electrical conductor core and the electrode of the light emitting element can be directly connected to each other via an electrically conductive joining member such as solder without using wires, thereby achieving a reduction in size of the light emitting device.

One light emitting element mounting base member is provided with a plurality of core members in order for the electrical conductor cores to serve as the electrodes of the light emitting device. At least two electrical conductor cores should be provided to the base member of the light emitting device to serve as the electrodes of the light emitting device. Further, a plurality of electrical conductor cores may be used as one electrode of the light emitting device. For example, the electrode of the light emitting element may be joined with the electrical conductor cores disposed adjacent to each other via an electrically conductive joining member. The disposition of the electrically conductive portion in the light emitting element mounting base member can be changed as appropriate by changing the positioning of the core members each having the electrical conductor core. This improves flexibility in designing the light emitting element mounting base member.

The electrical conductor cores are exposed at the upper surface 31 (i.e., the bottom surface of the recess 30) and the lower surface 32 of the light emitting element mounting base member. A single electrical conductor core may be exposed at the two positions, namely, at the upper surface and the lower surface. Alternatively, some of the electrical conductor cores may be exposed at the upper surface and some others may be exposed at the lower surface. Use of the electrical conductor core joined to the light emitting element as the external terminal of the base member improves the heat dissipation property.

In the case where the electrical conductor core is used not as the electrode but as the heat dissipation path, the electrical conductor core and the light emitting element may not be electrically connected to each other, and the electrical conductor core is not necessarily exposed at the surface of the light emitting element mounting base member. The electrical conductor core(s) is/are preferably disposed continuously from around the light emitting element being the heat source to around the outer surfaces of the light emitting element mounting base member, so that heat from the light emitting element is easily released to the outside.

Light-Reflecting Insulating Member

In the present embodiment, the light-reflecting insulating member covers the lateral surface of the electrical conductor core. The light-reflecting insulating member may have a single-layer structure, or a multilayer structure in which a plurality of layers are stacked. In the case of a plurality of layers, a thermosetting resin film can be provided on the side near the electrical conductor core and a joining layer on the outermost perimeter. This can achieve good productivity, because none or little adhesive agent is necessary, in forming the assembly of the core members.

The light-reflecting insulating member is formed, for example on the lateral surface of the electrical conductor core, as a single layer film or a multilayer film in a substantially uniform thickness. The light-reflecting insulating member has a thickness, for example, between several micrometers and several hundred micrometers. The light-reflecting insulating member preferably has a thickness of about several ten micrometers, because both the electrical insulation and a reduction in size of the light emitting device (or the light emitting element mounting base member) can be achieved. The light-reflecting insulating member may be formed in a substantially uniform thickness on the lateral surface of the electrical conductor core. Alternatively, the light-reflecting insulating member may be formed to be thicker at one area than at other area.

A portion of the electrical conductor core exposed outside the upper surface (i.e., the bottom surface of the recess 30) and the lower surface of the light emitting element mounting base member is also exposed from the light-reflecting insulating member. The light-reflecting insulating member is positioned around the electrical conductor core on the upper surface and the lower surface of the base member. The light-reflecting insulating member being interposed between a plurality of electrical conductor cores allows the plurality of electrical conductor cores to be disposed as being insulated from each other.

The light-reflecting insulating member is preferably made of a material using a resin as a base material in view of costs and manufacturability. A resin such as a thermosetting resin or a thermoplastic resin can be employed as the resin for the base material. Specific examples of such a resin include an epoxy resin composition; a silicone resin composition; a modified epoxy resin composition such as a silicone modified epoxy resin; a modified silicone resin composition such as an epoxy modified silicone resin; polyimide resin compositions and modified polyimide resin compositions; polyphthalamides (PPA); polycarbonate resins; liquid crystal polymers (LCP); ABS resins; phenol resins; acrylic resins; PBT resins; polypropylene resins (PP); polyamides (PA 6, PA66); polyphenylene sulfide resins (PPS); and polyether ether ketone resins (PEEK). The material of the base material can be selected from materials other than resin, for example, glass.

In order to provide the base material with light reflectivity, a light-reflecting material in shape of, for example, particulate or fibrous. Specific examples of such materials include titanium dioxide, silicon dioxide, zirconium dioxide, potassium titanate, alumina, aluminum nitride, boron nitride, mullite, niobium oxide, or various kinds of rare-earth oxides (e.g., yttrium oxide, gadolinium oxide) may be added to the base material or other member. The light-reflecting insulating member preferably exhibits high reflectivity to light emission wavelength of the light emitting element mounted thereon. For example, the light-reflecting insulating member is preferably set to exhibit the reflectivity on the average of 70% or more to the light emitted by the light emitting element in a range of 440 nm to 630 nm. Further, the light-reflecting insulating member preferably exhibits high average reflectivity than the employed electrical conductor core, in the range of 440 nm to 630 nm.

The light-reflecting insulating member may be formed in such a manner as to partially expose the electrical conductor core in advance. Alternatively, the entire surface of the electrical conductor core may be covered with the light-reflecting insulating member, and thereafter the light-reflecting insulating member may be partially removed, so that the surface of the electrical conductor core is exposed from the insulating member. In the case where the light-reflecting insulating member is removed later, for example, thermosetting resin can be used for the base material of the light-reflecting insulating member, and thermoplastic resin can be used for the light blocking resin. Therefore, the light-reflecting insulating member can be selectively dissolved with a chemical agent using the difference in dissolving speed. In this manner, removal of the light-reflecting insulating member can be performed not only by cutting, but also by dissolving.

Light Blocking Resin

The light blocking resin is an insulating member that integrally holds the plurality of core members.

Light blocking means herein that the resin is capable of blocking light from the light emitting element (e.g., mainly visible light) by, for example, 70%, preferably 90%, and further preferably 95% or more. The light blocking effect may be attained by reflecting light or absorbing light. The light blocking resin can be white or black, for example. This makes the resin base material less likely to degrade due to light.

The light blocking resin may be thermosetting resin, thermoplastic resin or other resin. In order to provide such resin with the light blocking property against light emitted by the light emitting element mounted thereon, a light-reflecting material, a light absorbing material or other materials can be added. Such an additive may be particulate, fibrous or other shape. The light blocking resin may be formed by a single material or a plurality of different materials. Further, the light blocking resin may present not only the space between a plurality of core members, but may also project on an upper side or a lower side. The light blocking resin composition is a material to be injected into a set of mold.

Light emitted to the resin positioned vicinity of the light emitting element (in particular, at the position in contact with the light emitting element or the position facing the light emitting element) is extremely high in density. As the light emitting device drives, the light may cause degradation or discoloration of the resin, thereby reducing the light emission efficiency of the light emitting device. Providing light blocking property to the resin positioned immediately below the light emitting element discourages deterioration of the resin due to light, and maintains the light emission efficiency of the light emitting device.

A resin such as a thermosetting resin or a thermoplastic resin can be employed for the resin for a base material of the light-blocking resin. Specific examples of such a resin include an epoxy resin composition; a silicone resin composition; a modified epoxy resin composition such as a silicone modified epoxy resin; a modified silicone resin composition such as an epoxy modified silicone resin; a polyimide resin composition, a modified polyimide resin composition; polyphthalamide (PPA); a polycarbonate resin; liquid crystal polymer (LCP); ABS resin; phenolic resin; acrylic resin; PBT resin; polypropylene resin (PP); polyamide (PA6, PA66); polyphenylene sulfide resin (PPS); and polyether ether ketone resin (PEEK).

A light-reflecting material is preferably added to such resin. To serve as the light-reflecting material, powder of a reflecting member that is less likely to absorb light from the light emitting element and is largely different in refractive index from the resin serving as the base material (e.g., TiO2, Al2O3, ZrO2, or MgO) may be dispersed. Thus, light can be efficiently reflected.

Metal Film

On the surface of the electrical conductor core exposed at the upper surface and the lower surface of the light emitting element mounting base member, the metal film may be formed by selective plating or other technique. The metal film on the upper surface of the light emitting element mounting base member, which is a side where the light emitting element is mounted, is preferably made of metal being highly reflective to light emitted by the light emitting element. The metal film on the lower surface of the light emitting element mounting base member serving as the external electrode of the light emitting device is preferably made of metal that is good in wettability to solder. In consideration of adhesion between the outermost metal film and the electrical conductor core, the metal film may include a metal film serving as a base layer. That is, the metal film may have a multilayer structure.

The metal film may be formed not only on the surface of the electrical conductor core, but also on the surface of the light-reflecting insulating member and/or the light blocking resin. For example, on at least one electrical conductor core on which the light emitting element is mounted, the metal film is formed across the surface of the electrical conductor core exposed at the surface of the light emitting element mounting base member and the surface of the insulating member and surface of the light blocking resin that are positioned outside the electrical conductor core. Provision of such a metal film allows heat from the light emitting element to spread in the lateral direction of the base part of the light emitting device.

The metal film may function as a wiring layer that electrically connects two or more electrical conductor cores to each other. For example, so as to connect between adjacent electrical conductor cores, respective surfaces of the electrical conductor cores and the insulating members and the light blocking resin positioned between the adjacent electrical conductor cores are covered with the metal film. Thus, a serial or parallel wiring can be formed, and flexibility in designing the base member of the light emitting device improves. For example, when a plurality of light emitting elements are connected in series with the increased drive voltage and the reduced drive current, the voltage drop or power loss is less likely to occur, thereby improving the energy efficiency as the light source improves.

The metal film may be provided after the formation of the light blocking resin. Alternatively, the metal film may be provided to the electrical conductor core before the formation of the light blocking resin.

Light Emitting Element

Examples of the light emitting element that can be mounted on the light emitting element mounting base member include a light emitting diode, a laser diode, a light emitting transistor, and a light emitting thyristor.

The light emitting element is preferably mounted on the exposed surface of the electrical conductor core in view of heat dissipation. An insulating member having good thermal conductivity or a thin insulating film may be provided between the light emitting element and the electrical conductor core. For example, the light emitting element using an insulating substrate such as a sapphire substrate can be junction-up mounted on the exposed surface of the electrical conductor core.

In the case where the flip-chip mounting (also referred to as the junction-down mounting) is performed, at least the pair of electrodes of the light emitting element is preferably electrically connected to two or more electrical conductor cores. In the case where bending stress is applied to the base part of the light emitting device, the bending stress tends to concentrate not on the metal portion but on the resin portion that easily deforms than the metal portion. Accordingly, in performing the flip-chip mounting, bending stress concentrating on the insulating part present near the light emitting element may break the light emitting element, disconnect or crack the conductive connecting member such as solder or bumps, thereby possibly leading non-lighting of the light emitting element. By arranging a plurality of electrical conductor cores near the light emitting element, the light emitting element mounting part of the base part of the light emitting device and the surrounding part are formed by a plurality of light-reflecting insulating members or the light blocking resin. Therefore such resin parts disperse the bending stress, and the bending stress is less likely to concentrate on the region around the light emitting element. As a result, the present embodiment can reduce light emitting device failures, such as non-lighting, due to external stress applied to the base part.

Further, as compared to a frame-insert type light emitting element mounting base member, the interval between the adjacent light emitting device housings is narrow. Accordingly, in an assembly of the light emitting device housings, the interval between the light emitting element mounting parts can be narrowed. Thus, the processing capacity of the chip mounter can be increased, to reduce the assembling costs.

Insulating Spacer Member

The light emitting element mounting base member according to the present embodiment may further include the insulating spacer member. By disposing the spacer member between the core member and the core member, the distance between the core members can be set. This enhances flexibility in designing the light emitting element mounting base member or the light emitting device.

The insulating spacer member may be made of the material similar to that of the light-reflecting insulating member. Using a resin material, singulating such as grinding, cutting, slicing can be easily performed. Further, the shape can be determined as appropriate depending on the design of the light emitting element mounting base member to be obtained. For example, the shape may be a cylindrical column, a prism (a polyhedron), a sphere (including an ellipsoid), a round pipe (a round tube), or any shape similar to the foregoing. Further, a joining layer may be provided to the outermost perimeter. In order to enhance the joining force to the light blocking resin, the insulating spacer member may have fine irregular surfaces.

Other than being spherical, the insulating spacer member may be linear in shape depending on the distance desired to be adjusted, such as a square bar-like shape, a round bar-like shape, or a beadroll-like shape formed by joining the foregoing shape. Further, the insulating spacer member may be film-like, or sheet-like with a certain thickness. When the protection devices are mounted inside the light emitting element mounting base member, the recesses are provided on predetermined positions on the insulating spacer members as appropriate.

Protection Device

The light emitting device may include the protection device that protects the light emitting element from breakdown due to overcurrent. The protection device may be, for example, a Zener diode or a capacitor. The protection device with an electrode on one side is preferable, so that the protection device can be face-down mounted without the necessity of using wires. For example, the protection device is connected to one of the lateral surfaces of the electrical conductor core, and provided inside the light emitting element mounting base member while being covered with the light blocking resin. The insulating member is removed from the connecting part between the protection device and the electrical conductor core. Thus, the protection device can be disposed inside the light emitting element mounting base member. This can reduce the risk of light from the light emitting element being absorbed or blocked by the protection device, thereby enhancing the light extraction efficiency of the light emitting device.

Encapsulating Member

The light emitting device may include the encapsulating member for protecting the light emitting element from external physical and chemical degradation factors. The encapsulating member need only be formed to directly or indirectly cover the light emitting element, and may be made of silicone resin or epoxy resin as a suitable material, for example. In case of an UV-LED, optical glass may be employed.

Other Members

The light emitting device may contain a light scattering member and/or a wavelength conversion member that converts part of light emitted by the light emitting element to light of different wavelength. For example, the encapsulating member may contain a wavelength conversion substance such as a fluorescent material. A resin member such as the light blocking resin may contain filler made of any appropriate substance, to adjust the property such as thermal conductivity or thermal expansion coefficient.

The present disclosure is applicable to various kinds of light sources, as a base member of a light emitting device that includes at least one light emitting element such as an LED chip.

What is claimed is:

1. A method of manufacturing a light emitting element mounting base member comprising:
   arranging a plurality of core members each including an electrical conductor core and a light-reflecting insulating member provided on a surface of the electrical conductor core;
   cutting the arranged core members to form a base member preparatory body including at least one cut surface on which at least one of the electrical conductor core and the insulating member are exposed; and
   insert molding by placing the base member preparatory body in a set of mold, and injecting a light blocking resin composition into the set of mold so that at least one electrical conductor core or at least one metal film formed on the at least one electrical conductor core are exposed on at least one outer surface of the light emitting element mounting base member.

2. The method of manufacturing a light emitting element mounting base member according to claim 1, further comprising,
   disposing the metal film on at least one portion of the cut surface where the at least one electrical conductor core is exposed, prior to the insert molding.

3. The method of manufacturing a light emitting element mounting base member according to claim 1, further comprising,
   disposing the metal film on at least one portion of the cut surface where the at least one electrical conductor core is exposed, after the insert molding.

4. The method of manufacturing a light emitting element mounting base member according to claim 1, further comprising, adjusting positions of the core members using at least one insulating spacer member, in the arranging of the plurality of core members.

5. The method of manufacturing a light emitting element mounting base member according to claim 1,
wherein the core members and/or an insulating spacer member are each columnar in shape.

6. The method of manufacturing a light emitting element mounting base member according to claim 1, further comprising,
electrically connecting at least one protection device to at least one predetermined lateral surface of the core members, prior to the insert molding.

7. The method of manufacturing a light emitting element mounting base member according to claim 1, further comprising,
forming recesses on the light emitting element mounting base member by injecting the light blocking resin composition into a space in the set of mold with projection portions pressing the electrical conductor cores,
wherein the recesses each includes a bottom surface where the at least one electrical conductor core is exposed.

8. The method of manufacturing a light emitting element mounting base member according to claim 1, further comprising
cutting the light blocking resin such that each cut piece includes at least two core members.

9. A method of manufacturing a light emitting device comprising,
mounting at least one light emitting element on the light emitting element mounting base member manufactured by the method according to claim 1.

* * * * *